(12) United States Patent
Bösl et al.

(10) Patent No.: US 10,727,384 B2
(45) Date of Patent: Jul. 28, 2020

(54) DEVICE WITH SEMICONDUCTOR CHIPS ON A PRIMARY CARRIER

(71) Applicant: OSRAM OLED GMBH, Regensburg (DE)

(72) Inventors: Florian Bösl, Regensburg (DE); Matthias Sabathil, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/228,588

(22) Filed: Dec. 20, 2018

(65) Prior Publication Data
US 2019/0189874 A1   Jun. 20, 2019

(30) Foreign Application Priority Data
Dec. 20, 2017   (DE) .......................... 10 2017 130 764

(51) Int. Cl.
| | |
|---|---|
| *H01L 33/60* | (2010.01) |
| *H01L 33/50* | (2010.01) |
| *H01L 33/54* | (2010.01) |
| *H01L 33/62* | (2010.01) |
| *H01L 25/075* | (2006.01) |
| *H01L 33/00* | (2010.01) |

(52) U.S. Cl.
CPC ............ *H01L 33/60* (2013.01); *H01L 33/505* (2013.01); *H01L 33/54* (2013.01); *H01L 25/0753* (2013.01); *H01L 33/0095* (2013.01); *H01L 33/62* (2013.01); *H01L 2933/005* (2013.01); *H01L 2933/0041* (2013.01); *H01L 2933/0058* (2013.01); *H01L 2933/0091* (2013.01)

(58) Field of Classification Search
None
See application file for complete search history.

(56) References Cited

U.S. PATENT DOCUMENTS

| | | | |
|---|---|---|---|
| 2012/0018754 A1* | 1/2012 | Lowes | G02F 1/1334 257/98 |
| 2012/0162965 A1* | 6/2012 | Takeuchi | F21V 23/002 362/84 |

(Continued)

FOREIGN PATENT DOCUMENTS

| | | |
|---|---|---|
| CN | 104300075 A | 1/2015 |
| WO | 2017153216 A1 | 9/2017 |

*Primary Examiner* — Shaun M Campbell
(74) *Attorney, Agent, or Firm* — Slater Matsil, LLP

(57) ABSTRACT

A device with semiconductor chips on a primary carrier is disclosed. In an embodiment a device includes a primary carrier, a plurality of semiconductor chips arranged on the primary carrier, a radiation conversion material arranged at least in places on the semiconductor chips and the primary carrier, a secondary carrier to which the primary carrier is attached and a scattering body arranged on a front side of the secondary carrier facing the primary carrier, the scattering body covering the semiconductor chips, wherein the primary carrier is formed reflective to primary radiation at least in a region of the semiconductor chips, and wherein, during operation of the device, at least secondary radiation exits through a front side of the scattering body facing away from the secondary carrier and through a rear side of the secondary carrier facing away from the primary carrier.

10 Claims, 4 Drawing Sheets

(56) References Cited

U.S. PATENT DOCUMENTS

| | | | |
|---|---|---|---|
| 2014/0268771 A1* | 9/2014 | Heikman | F21V 29/004 362/249.02 |
| 2015/0003039 A1* | 1/2015 | Liu | F21K 9/00 362/84 |
| 2016/0087169 A1 | 3/2016 | Yamada et al. | |
| 2019/0252460 A1* | 8/2019 | Andrews | H01L 33/62 |

* cited by examiner

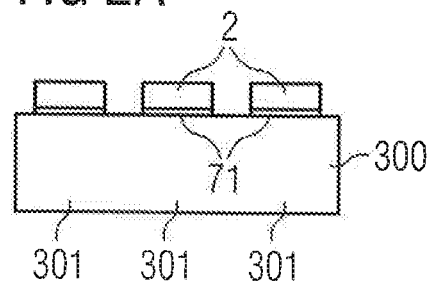
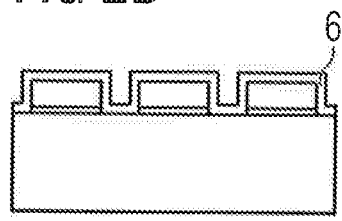
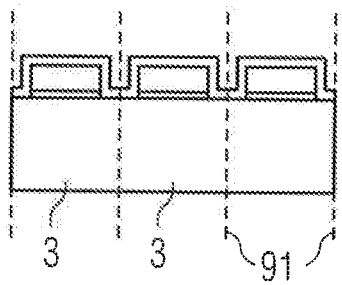
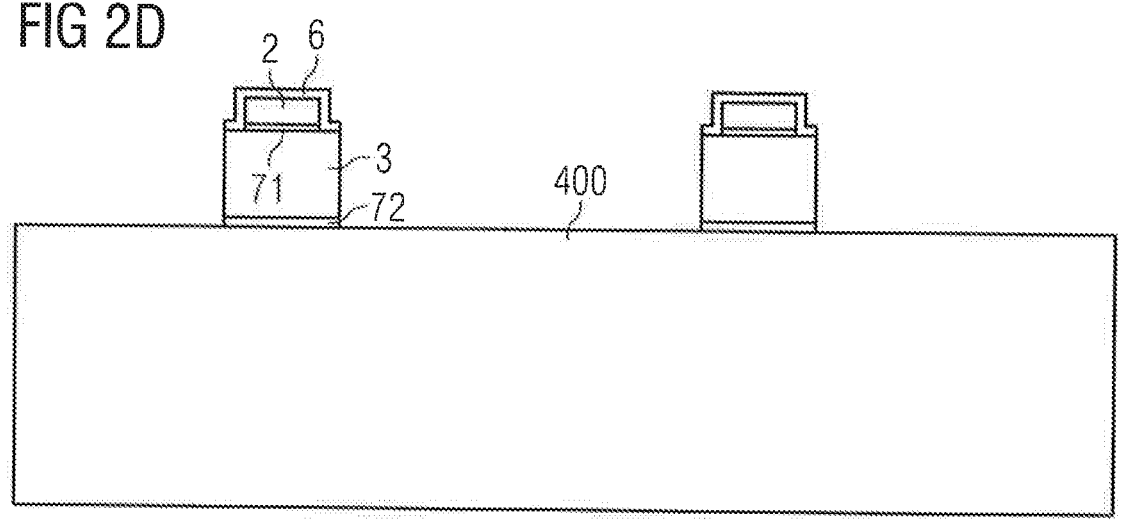

DEVICE WITH SEMICONDUCTOR CHIPS ON A PRIMARY CARRIER

CROSS-REFERENCE TO RELATED APPLICATIONS

This application claims the benefit of German patent application 102017130764.8, filed on Dec. 20, 2017, which application is hereby incorporated herein by reference.

TECHNICAL FIELD

The present application relates to an in particular radiation emitting device on a primary carrier and to a method for producing such a device.

BACKGROUND

Conventional light bulbs are increasingly being replaced by light sources based on light emitting diodes. In particular, LED filaments, in which several LEDs are arranged on a strip-shaped substrate and surrounded by a silicone matrix, are used. These LED filaments simulate the filament of a conventional light bulb and produce an omnidirectional radiation. Such filaments can be incorporated into a glass bulb, which is identical to the gas bulb of incandescent lamps. However, the production of such LED filaments differs substantially from the production of other LED-based devices, such as surface-mountable devices. This typically requires a separate production line for the LED filaments. In addition, the production is cost-intensive, since the coating with the silicone matrix is complex and requires comparatively much material.

SUMMARY

Embodiments provide a device that is simple and reliable to produce and has good radiation characteristics. Further embodiments provide a method, with which such a device can be simply and efficiently produced.

In embodiments, a device is provided which is intended in particular for the generation of radiation, e.g., in the visible spectral range. The device has in particular a main extension direction.

According to at least one embodiment of the device, the device comprises a plurality of semiconductor chips formed to generate radiation. For example, the semiconductor chips are formed as luminescence diode chips, in particular as light emitting diode chips. The radiation to be generated is located, for example, in the ultraviolet, visible or infrared spectral range. For example, the device has at least five or at least ten semiconductor chips.

According to at least one embodiment of the device, the device has a primary carrier. The primary carrier is mechanically stable at least to the extent that it can support its own weight.

For example, the extension of the primary carrier along the main extension direction is at least five times greater than in a transverse direction perpendicular to the main extension direction. In particular, all semiconductor chips of the device are arranged on the primary carrier. For example, the length of the primary carrier, i.e., the extension along the main extension direction of the device, is at least 70% or at least 90% of the extension of the entire device along this direction.

For example, the semiconductor chips are arranged on the primary carrier and attached in particular to the primary carrier. For example, the semiconductor chips are arranged next to one another on the primary carrier along the main extension direction, in particular in exactly one row.

As seen in vertical direction, there is only a first connection layer between the front side of the primary carrier and the semiconductor chips, such as an adhesive layer for attaching the semiconductor chips to the primary carrier.

A vertical direction is a direction perpendicular to the front side of the primary carrier.

According to at least one embodiment of the device, the device has a radiation conversion material. The radiation conversion material is formed to convert at least a part of the primary radiation generated by the semiconductor chips in operation into secondary radiation. In particular, the radiation conversion material is arranged at least in places on the semiconductor chips and the primary carrier. For example, the radiation conversion material partially converts primary radiation in the blue or ultraviolet spectral range into secondary radiation with a different peak wavelength from the primary radiation, for example, in the yellow and/or red spectral range, so that the device emits mixed radiation that appears white to the human eye. Alternatively, the primary radiation, for example, in the blue or ultraviolet spectral range, can also be completely converted into secondary radiation.

According to at least one embodiment of the device, the primary carrier is formed reflective to the primary radiation at least in the region of the semiconductor chips. "Formed reflective" generally means that at least a part of the radiation incident on the primary carrier is directed and/or diffusely reflected at the primary carrier. For example, at least 40% or at least 60% or at least 80% of the radiation incident on the primary carrier is directed and/or diffusely reflected at the primary carrier. In other words, the primary carrier, for example, is partially transmissive or completely impermeable to primary radiation. For example, a partially transmissive primary carrier is formed to be so strongly scattering that the radiation emitted by the semiconductor chips onto the primary carrier does not pass through the primary carrier directly in the vertical direction, or at least to a small extent, for example, not more than 10%. "Directly passing through" means that the radiation passing through does not experience any scattering as it passes through.

For example, the primary carrier is formed from a reflective material. Alternatively or in addition, the primary carrier is coated with a reflective material. For example, the primary carrier contains or consists of a diffusely scattering ceramic. For example, the ceramic contains aluminum oxide.

According to at least one embodiment of the device, the device has a secondary carrier. The primary carrier is attached in particular to the secondary carrier, for example, by means of a second connecting layer. As seen in a vertical direction, the secondary carrier extends between a front side facing the primary carrier and a rear side of the secondary carrier facing away from the primary carrier. In particular, the rear side forms an outer surface of the device. The secondary carrier is formed transparent in particular to the radiation generated in the semiconductor chips and/or in the radiation conversion material. For example, if radiation passes vertically through the secondary carrier, a maximum of 5% of the radiation is absorbed.

According to at least one embodiment of the device, the device has a scattering body. For example, the scattering body completely covers the semiconductor chips. The scattering body can extend continuously over several or all semiconductor chips of the device. The scattering body, for example, is arranged on the front side of the secondary carrier, in particular, only on the front side of the secondary carrier. The side surfaces of the secondary carrier and/or the rear side of the secondary carrier are free of the scattering body at least in places, in particular completely.

For example, the scattering body is formed on the radiation conversion material, the primary carrier, in particular on a side surface of the primary carrier, and/or the secondary carrier, in particular on the front side of the secondary carrier, and optionally directly adjoins one or more of these elements.

In particular, the scattering body does not adjoin the semiconductor chips directly at any point. For example, the radiation conversion material is located at every point between the semiconductor chips and the scattering body.

Expediently, the scattering body is formed to be electrically insulating. For example, the scattering body contains a plastic. For example, the plastic can be processed by a molding process.

A molding process is generally understood to be a process by means of which a molding compound can be formed to a predetermined shape and, if necessary, can be cured. In particular, the term 'molding process' includes molding, film assisted transfer molding, injection molding, transfer molding, liquid transfer molding and compression molding.

A cross-section of the scattering body, for example, decreases perpendicular to the main extension direction of the device with increasing distance from the main extension direction. For example, a cross-section of the scattering body is bended in places, in particular at the front side of the scattering body.

According to at least one embodiment of the device, at least the secondary radiation exits during operation of the device through a front side of the scattering body facing away from the secondary carrier and through a rear side of the secondary carrier facing away from the primary carrier. The scattering body and the secondary carrier thus each form outer surfaces of the device at which the radiation exits.

In at least one embodiment of the device, the device has a primary carrier and a plurality of semiconductor chips, which are formed to generate radiation and are arranged on the primary carrier, a radiation conversion material which at least partially converts primary radiation generated by the semiconductor chips in operation into secondary radiation being arranged at least in places on the semiconductor chips and the primary carrier. The primary carrier is formed reflective to the primary radiation at least in the area of the semiconductor chips. The device has a secondary carrier to which the primary carrier is attached. A scattering body is arranged on a front side of the secondary carrier facing the primary carrier, the scattering body covering the semiconductor chips. During operation of the device, at least the secondary radiation exits through a front side of the scattering body facing away from the secondary carrier and through a rear side of the secondary carrier facing away from the primary carrier.

According to at least one embodiment of the device, a side surface of the primary carrier and the radiation conversion material terminate flush. The radiation conversion material thus extends in lateral direction at least in places up to an edge of the primary carrier and ends there.

According to at least one embodiment of the device, the side surfaces of the primary carrier and the radiation conversion material show traces of a material removal. The traces are, for example, traces of a mechanical material removal, for example, by sawing, of chemical material removal, for example, by etching, or of material removal by coherent radiation, for example, by a laser cutting process. The material removal occurs during production, particularly during a separation step in which the primary carriers are separated from a composite. In particular, the primary carrier may show such traces on at least two opposite side surfaces or also on four side surfaces.

According to at least one embodiment of the device, at least 30% and at most 60% of the total radiated radiation exits the device through the secondary carrier. The remaining part exits the device, in particular through the scattering body. For example, the scattering body is formed in such a way that the device radiates at all angles in a section perpendicular to the main extension direction.

According to at least one embodiment of the device, the scattering body contains diffusers in a proportion of at least 5% by weight and at most 30% by weight. It has been shown that a diffuser portion in this region causes an efficient backscattering in the direction of the secondary carrier without having to accept excessive losses in the overall efficiency.

According to at least one embodiment of the device, a transverse extent of the scattering body along a direction perpendicular to the main extension direction and parallel to the front side of the secondary carrier is between and including twice as large and including ten times as large as a transverse extent of the primary carrier along this direction, in particular between and including three times as large and including seven times as large as the transverse extent of the primary carrier. An efficient backscattering in the direction of the secondary carrier can thus be achieved with a comparatively low lateral extent of the scattering body.

According to at least one embodiment of the device, the device has an end contact at each opposite end along the main extension direction. For example, the end contacts are arranged on the secondary carrier. The end contacts each form a contact surface accessible from the outside for the external electrical contacting of the device, so that by applying an electrical voltage during operation of the device between the two end contacts a current flows through the device and radiation is generated.

The end contacts can also be used for fixing the device. For example, the end contacts of the device are formed in such a way that they can be spot welded. For example, the end contacts contain a metal such as steel.

In particular, the semiconductor chips are electrically connected to one another, so that all semiconductor chips can be electrically operated via exactly two end contacts. For example, all semiconductor chips of the device are in an electrical series connection.

According to at least one embodiment of the device, the primary carrier has a connecting surface at each opposite end along the main extension direction. For example, the connecting surfaces are each connected via a connecting line to the semiconductor chip closest to the respective connecting surface. For example, the end contacts are each electrically connected to one of the connecting surfaces via a connector. The connector is, for example, a connecting line such as a wire bond connection or a connecting agent such as an electrically conductive adhesive or a solder.

According to at least one embodiment of the device, the device is an LED filament. For the external electrical contacting of the device in a glass bulb, the LED filament is in particular formed for spot welding.

In various further embodiments, a method for the production of a plurality of devices is provided.

According to at least one embodiment of the method, the method comprises a step of providing a primary carrier composite having a plurality of primary carrier regions. For example, the primary carrier regions are arranged next to one another along one direction or along two directions running perpendicular to one another.

According to at least one embodiment of the method, the method comprises a step, in which a plurality of semiconductor chips formed to generate radiation are arranged on the primary carrier composite and are in particular attached, for example, by means of a first connecting layer.

According to at least one embodiment of the method, the method comprises a step, in which an electrically conductive connection is produced between the semiconductor chips of the respective primary carrier regions. In particular, all semiconductor chips of a primary carrier region are electrically connected to one another in series. The semiconductor chips that are closest to the ends of the primary carrier regions are electrically conductively connected, for example, to connecting surfaces on the primary carrier region. For example, adjacent semiconductor chips are electrically connected to one another via connecting lines, such as wire bond connections.

According to at least one embodiment of the method, the method comprises a step, in which a radiation conversion material is formed on the primary carrier composite with the semiconductor chips. The primary carrier composite can be coated with the radiation conversion material either over its entire surface or essentially over its entire surface, for example, at an area proportion of at least 90%. In particular, the side surfaces of the semiconductor chips are completely covered with radiation conversion material. In particular, the entire radiation conversion material contained in the device to be produced is applied in a single step and in particular only on one side of the primary carrier composite.

According to at least one embodiment of the method, the method comprises a step, in which the primary carrier composite is separated into a plurality of primary carriers, in particular between adjacent primary carrier regions. During separation, the side surfaces of the primary carrier are formed, in particular after the application of the radiation conversion material. The side surfaces are free of the radiation conversion material.

According to at least one embodiment of the method, the method comprises a step in which the primary carrier is arranged on a secondary carrier and, in particular, is attached, for example, by means of a second connecting layer. The secondary carrier may be pre-fabricated or may be still in the form of a composite that is severed at a later time.

According to at least one embodiment of the method, the method comprises a step, in which a scattering body is formed on the secondary carrier with the primary carrier, in particular by means of a molding process. The scattering body is formed in particular on the radiation conversion material and the secondary carrier. For example, at least one primary carrier on the associated secondary carrier is placed in a casting mold to form the scattering body. The term 'casting mold' generally refers to the mold used for the molding process and does not imply any restriction to a particular molding process.

At the time of the application of the scattering body, the secondary carrier may already have end contacts for the external electrical contacting of the device. At least a part of the end contacts remains free of the scattering body so that the end contacts are externally accessible for electrical contacting.

In at least one embodiment of the method, a primary carrier composite with a plurality of primary carrier regions is provided. A plurality of semiconductor chips formed to generate radiation are arranged on the primary carrier composite. An electrically conductive connection is produced between the semiconductor chips of the respective primary carrier regions. A radiation conversion material is formed on the primary carrier composite with the semiconductor chips. The primary carrier composite is separated between adjacent primary carrier regions into a plurality of primary carriers. One of the primary carriers is arranged on a secondary carrier. A scattering body is formed on the secondary carrier with the primary carrier.

The method is preferably carried out in the specified sequence given in the above listing. In particular, the separation is the final step in the method of the primary carrier so that all the previous stages of production can be carried out in a single composite.

According to at least one embodiment of the method, the radiation conversion material is applied by a spraying process. Due to the comparatively dense arrangement of the semiconductor chips on the primary carrier composite, the radiation conversion material can be produced efficiently with comparatively low material requirements.

According to at least one embodiment of the method, the secondary carrier is provided in a secondary carrier composite when the primary carrier is arranged and the secondary carrier composite is separated after the scattering body has been formed. In particular, several scattering bodies can be formed simultaneously on the secondary carrier composite.

According to at least one embodiment of the method, the radiation conversion material is separated during separation of the primary carrier composite. Radiation conversion material and primary carrier composite material can therefore be processed in a single step, for example, by sawing or another separation process mentioned above.

According to at least one embodiment of the method, the separated primary carriers each have two connecting surfaces, which are electrically conductively connected to the semiconductor chips on the primary carrier, wherein the secondary carrier has end contacts for the external electrical contacting of the device, and wherein the end contacts are each electrically conductively connected to a connecting surface prior to the formation of the scattering body. This can take place together with the attachment of the primary carrier to the secondary carrier or after the attachment of the primary carrier to the secondary carrier.

The method described is particularly suitable for the production of a device described above. Features described in connection with the device can therefore also be used for the method and vice versa.

In particular, the following effects can be achieved with the device or the method.

The devices can be produced with a similar process sequence as other components that have a lead frame, such as surface-mountable components. In particular, the semiconductor chips can be arranged on the primary carrier composite before the primary carrier is separated. It is therefore not necessary to equip individual carriers such as glass strips with individual semiconductor chips.

The radiation conversion material can also be applied to the primary carrier, for example, by spray coating. Since the transverse extent of the primary carriers is small compared to the transverse extent of the secondary carriers, the primary carrier can be coated with a high packing density of the semiconductor chips, which leads to low material consumption and thus to high cost savings.

Furthermore, a one-sided coating of the primary carrier is sufficient, in particular since the primary carrier is radiation-impermeable and therefore the semiconductor chips can only radiate through the radiation conversion material on the front side of the primary carrier. Conventional LED filaments, in contrast, typically require a converter layer on both sides.

Overall, the volume of radiation conversion material is reduced to a minimum. This results in a filigree appearance of the device. In contrast, common LED filaments often look thick and clumsy.

After separation, the primary carrier with the semiconductor chips and the radiation conversion material forms a "luminous strip", which can subsequently be applied to a secondary carrier. This secondary carrier can increase the mechanical stability of the device and at the same time serve as a heat sink. A cost-effective material can be selected for the secondary carrier, such as glass.

The "luminous stripe" would no radiate towards the rear side of the primary carrier and would therefore produce a highly asymmetrical light distribution. However, the emission characteristics of the device can be controlled by means of the scattering body. In particular, an efficient deflection of a part of the radiated radiation can be achieved so that the device radiates perpendicularly to the main extension direction into all angles. An approximately omnidirectional light distribution can thus be achieved.

Overall, the combination of a reflecting, for example, a radiation-impermeable or strongly scattering, primary carrier with a radiation-permeable secondary carrier, in particular in conjunction with the one-sided radiation conversion material and the scattering body, can achieve a device in a particularly cost-effective manner which combines an approximately omnidirectional radiation and a filigree appearance.

BRIEF DESCRIPTION OF THE DRAWINGS

Further features, embodiments and formed result from the following description of the exemplary embodiments in connection with the figures.

They show:

FIGS. 2A, 2B, 2C, 2D, 2E and 2F are exemplary embodiments of a method of producing a device by means of intermediate steps each represented in a schematic sectional view.

Same, similar or similar elements are provided in the figures with the same reference signs.

The figures and the proportions of the elements shown in the figures are not to be regarded as true to scale. Rather, individual elements and in particular layer thicknesses may be exaggeratedly large for better representability and/or better understanding.

DETAILED DESCRIPTION OF ILLUSTRATIVE EMBODIMENTS

Figure 1A:
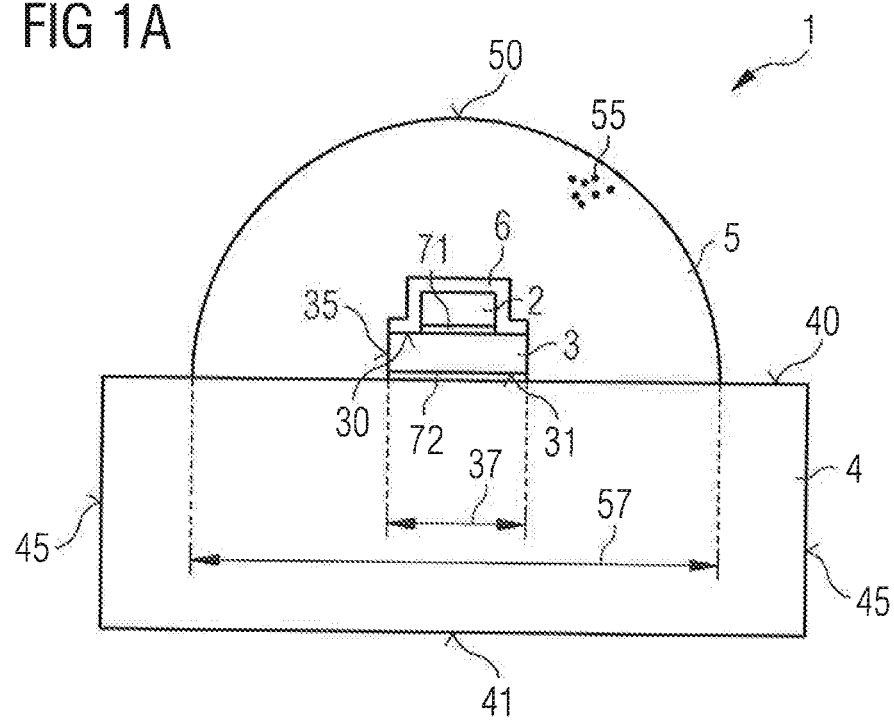
FIGS. 1A, 1B, and 1C are exemplary embodiments using a schematic top view (FIG. 1B), a corresponding sectional view along the line AA' in FIG. 1A, and a spatial radiation simulation result in FIG. 1C.
Figure 1B:
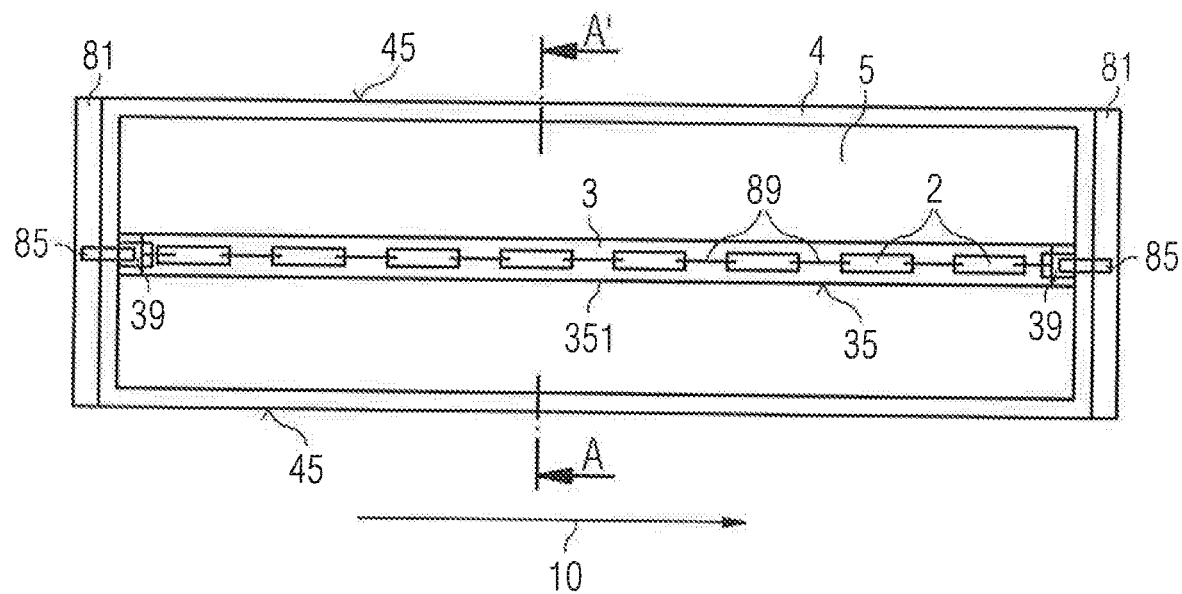

FIGS. 1A and 1B show an exemplary embodiment of a device 1. The device 1 has a primary carrier 3 on which a plurality of semiconductor chips 2 formed to generate radiation are arranged. The semiconductor chips 2 are attached to the primary carrier 3 by means of a first connecting layer 71.

The description is made exemplarily by means of a device 1, which is formed as an LED filament. In principle, however, the structure of the device 1 is also suitable for all other types of devices for which omnidirectional radiation is particularly desired.

The primary carrier 3 extends in the vertical direction between a front side 30 facing the semiconductor chips 2 and a rear side 31 facing away from the semiconductor chips 2.

The device 1 further comprises a radiation conversion material 6. The radiation conversion material 6 is intended to convert primary radiation generated by the semiconductor chips 2 completely or at least partially into secondary radiation, so that the device 1 emits light appearing white to the human eye, for example. The radiation conversion material 6 is adjacent to the semiconductor chips 2 and a front side 30 of the primary carrier 3.

The primary carrier 3 is formed reflective for the primary radiation. For example, the primary carrier 3 is formed to be radiation-impermeable for the primary radiation and the secondary radiation. Thus, the radiation cannot be radiated from the semiconductor chip 2 directly in the vertical direction through the primary carrier 3.

The radiation conversion material 6 completely covers the semiconductor chips 2, in particular also the side surfaces of the semiconductor chips, so that no radiation can exit from the semiconductor chips 2 without passing through the radiation conversion material 6.

Deviating from this, the primary carrier 3 can also be partially transmissive, in particular strongly scattering, for the primary radiation. Even if in this case an excessive amount of unconverted primary radiation passes through the primary carrier, a sufficiently high color homogeneity can be achieved by sufficiently strong scattering in the primary carrier.

The device 1 also comprises a secondary carrier 4. The secondary carrier 4 extends in the vertical direction between a front side 40 facing the primary carrier 3 and a rear side 41 facing away from the primary carrier 3.

A scattering body 5 of the device 1 is arranged on the front side 40 of the secondary carrier 4. The scattering body 5 is in particular directly adjacent to the radiation conversion material 6 and to the secondary carrier 4, in particular to the front side 40 of the secondary carrier. In particular, the scattering body is formed the radiation conversion material 6 and the secondary carrier 4, so that no bonding layer such as an adhesive layer is required for attaching the scattering body.

The scattering body 5 is intended to scatter radiation emitted by the semiconductor chips 2 and the radiation conversion material 6 and in particular to partially deflect it in the direction of the secondary carrier 4, so that during operation of the device 1 radiation can also exit through the rear side 41 of the secondary carrier 4. During operation of device 1, at least the secondary radiation exits through a front side 50 of the scattering body 5 facing away from the secondary carrier 4 and through the rear side 41 of the secondary carrier 4. In particular, the entire radiation emitted by the device 1 is emitted either through the scattering body 5 or through the secondary carrier 4.

The primary carrier 3 with the semiconductor chips 2 and the radiation conversion material 6 forms a "luminous strip", wherein this luminous strip can be produced in a composite during the production of the device. This is explained in more detail in connection with FIGS. 2A to 2F. The radiation conversion material 6 and the primary carrier 3 terminate flush at a side surface 35 of the primary carrier 3. The side surfaces of the primary carrier and the radiation conversion material show traces of a material removal. These traces 351 arise from the separation of the primary carrier from the composite. For the sake of simplicity, the traces 351 are shown only in a partial region of FIG. 1B. The traces 351 may extend over the entire side surface 35 of the primary carrier 3 and may in particular be present on at least two side surfaces 35 or all side surfaces of the primary carrier 3.

The device 1 has a main extension direction 10. Along this main extension direction 10, the extension of device 1 is large compared to a transverse extent perpendicular thereto, for example, at least five times as large or at least ten times as large.

The semiconductor chips 2 are arranged next to one another in a row along the main extension direction 10, in particular in exactly one row, and are electrically conductively connected to one another by means of connecting lines 89, such as wire bond connections. For example, the semiconductor chips 2 each have two contacts intended for electrical contacting, which are provided on a front side of the semiconductor chips 2 facing away from the primary carrier 3 for contacting via the connecting lines 89. These contacts are not shown explicitly for simplified representation in the figures.

Viewed along the main extension direction, the device 1 has an end contact 81 at each opposite end of the device 1. By applying an external electrical voltage between the end contacts 81, all semiconductor chips 2 of the device 1 can be supplied with current, so that the semiconductor chips 2 emit radiation. The end contacts 81, for example, are arranged on the secondary carrier 4. For example, the end contacts 81 can be spot welded. This means that end contacts 81 can be used both for electrical contacting and for mechanical attaching of the device 1, for example, in a glass bulb.

The primary carrier 3 has a connecting surface 39 at each opposite end along the main extension direction 10. The connecting surfaces 39 are each electrically conductively connected to the semiconductor chip 2 closest to the connecting surface, for example, via a connecting line. The connecting surfaces 39 are each electrically conductively connected to an end contact 81 of device 1, for example, via a connector 85. For example, the connector 85 is also a connecting line, for example, a wire bond connection, or a connecting means, such as an electrically conductive adhesive or a solder.

The spatial radiation characteristic of the device 1 can be specifically influenced via the scattering body 5. For example, the scattering body contains 5 diffusers of at least 5% by weight and at most 30% by weight. A diffusor component in this area allows a sufficiently large proportion of the total radiated radiation to exit through the secondary carrier 4, although direct radiation injection in the vertical direction below the semiconductor chip 2 does not occur due to the radiation-impermeable primary carrier 3.

Figure 1C:
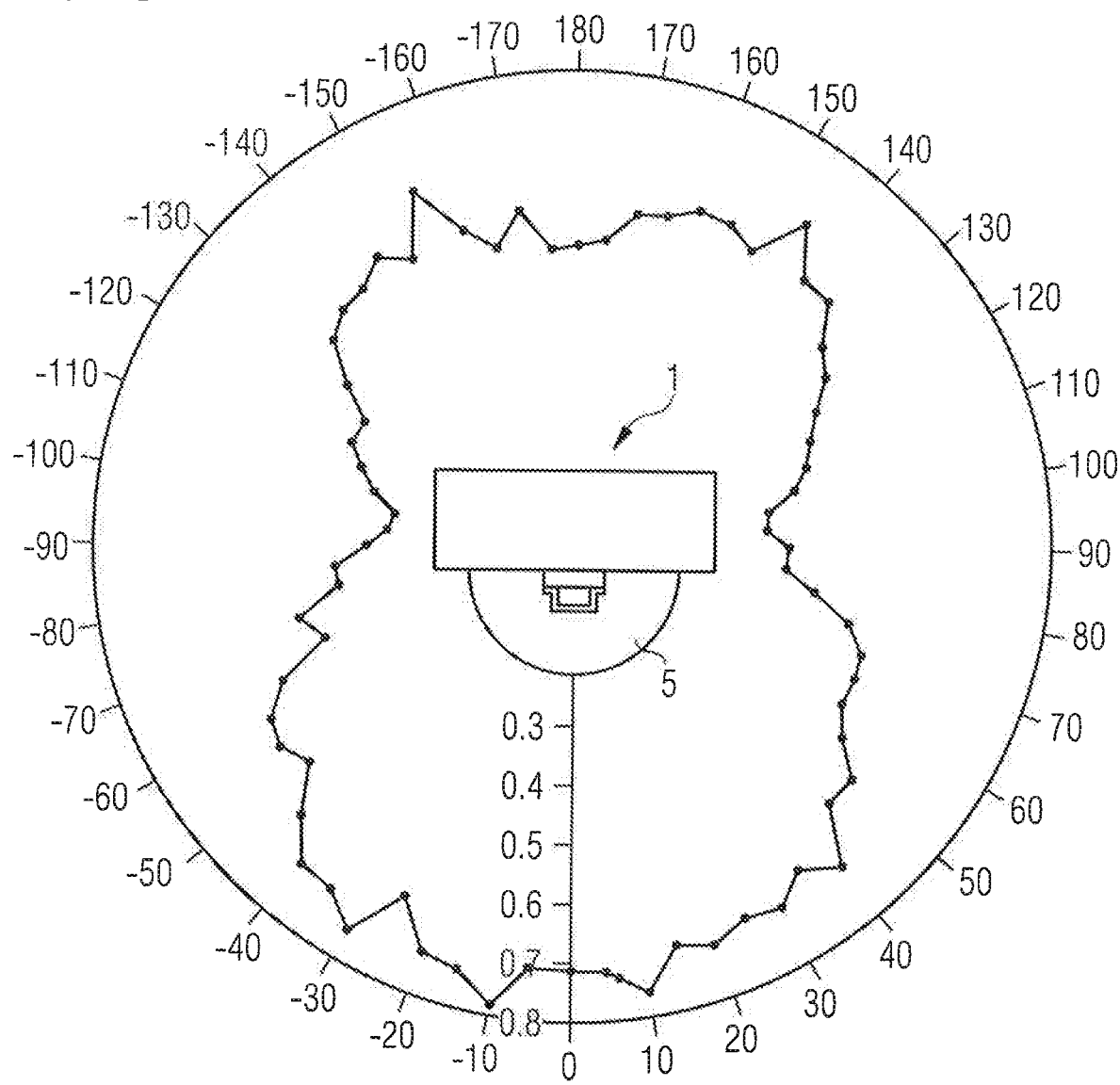

For example, at least 30% and at most 60% of the total radiated radiation exits the device 1 through the secondary carrier 4. FIG. 1C shows simulation results of the angular distribution of the radiation perpendicular to the main extension direction.

The simulations demonstrate that also through the rear side of the secondary carrier 4 a sufficiently large radiation portion for an at least approximately uniform omnidirectional radiation is emitted.

A transverse extent 57 perpendicular to the main extension direction 10 and parallel to the front side 40 of the secondary carrier 4 is in particular between and including twice the size and including ten times the size, for example, between and including three times the size and including seven times the size of a transverse extent 37 of the primary carrier 3 along that direction.

This allows sufficient radiation from the scattering body 5 to be coupled into the secondary carrier 4 at the side of the primary carrier 3 without requiring an excessively large transverse extent of the secondary carrier 4.

The secondary carrier 4, for example, has a thickness between 300 µm and 1000 µm inclusive, about 700 µm. A transverse extent of the secondary carrier, i.e., an extension between the side surfaces 45 of the secondary carrier, is, for example, between 1000 µm and 3000 µm inclusive, about 2000 µm. For the secondary carrier 4, a comparatively inexpensive transparent material can be used, such as glass. In addition to its function as a mechanical carrier, the secondary carrier 4 can also fulfil the function of a heat sink. Glass, for example, has a thermal conductivity of about 1 W/(m·K). For a further increase in heat dissipation, a material with a higher thermal conductivity can also be used for the secondary carrier, for example, sapphire with a thermal conductivity of 30 W/(m·K).

For the primary carrier 3, for example, a ceramic having a strong scattering effect, such as a ceramic containing aluminum oxide, is suitable. Alternatively or in addition, the primary carrier 3 may also be provided with a reflective coating on the front side 30 of the primary carrier, e.g., radiation-impermeable or partially transmissive.

Unlike a conventional LED filament, the outer surface of the device 1 is not formed by a material in which a radiation conversion material is embedded. This results in a particularly filigree optical impression for the device.

An exemplary embodiment of a method of producing a device is shown schematically in FIGS. 2A to 2F using intermediate steps. The description is made exemplarily by means of a device which is formed as described in connection with the FIGS. 1A to 1C.

A primary carrier composite 300 with a plurality of primary carrier regions 301 is provided. For simplified illustration, FIG. 2A shows only three primary carrier regions 301. A plurality of semiconductor chips 2 formed to generate radiation are arranged on the primary carrier composite 300 and are attached to the primary carrier composite, for example, by means of a first connecting layer 71.

Between the semiconductor chips 2 of a primary carrier regions 301 an electrically conductive connection is shown, for example, via connecting lines as shown in FIG. 1B. In the sectional view of FIG. 2A, these connecting lines are not visible.

Subsequently, a radiation conversion material 6 is applied to the semiconductor chips 2 (see FIG. 2B). A spray process is particularly suitable for this purpose. During this production step, the semiconductor chips 2 are arranged in a high packing density on the primary carrier composite 300, so that a spraying process does not require a high material requirement and can therefore be carried out cost-effectively. In the following, the primary carrier composite 300, as shown in FIG. 2C, is separated along separating lines 91 between adjacent primary carrier regions 301.

During separation, the radiation conversion material 6 is also severed, so that the radiation conversion material 6 terminates flush with the side surfaces of the individual primary carriers created during separation. This separation produces "luminous stripes", which can subsequently be placed on a secondary carrier.

As shown in FIG. 2D, the primary carriers 3 with the semiconductor chips arranged on them can be arranged on a secondary carrier composite 400 and attached to the secondary carrier composite by means of a second connecting layer 72.

For the first connecting layer 71 and/or the second connecting layer 72, for example, an adhesive is suitable, in particular a radiation transmissive adhesive.

Figure 2E:
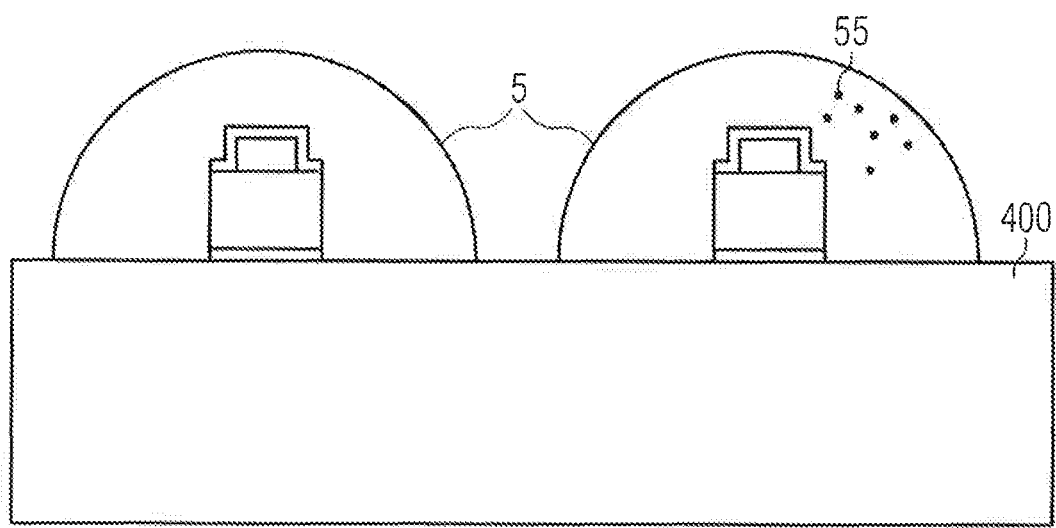

Subsequently, a scattering body 5 is formed on the secondary carrier composite 400 with the primary carriers 3, for example, by means of a molding process (FIG. 2E). For this purpose, injection molding or transfer molding or another of the molding processes mentioned in the general part is suitable.

At the time of forming the scattering body 5, the secondary carrier 4 may already have end contacts 81 (see FIG. 1B), via which the device 1 to be produced can be electrically contacted externally. Preferably, the connecting surfaces 39 on the primary carrier 3 are electrically conductively connected to one another before the scattering body 5 is formed, for example, with a connector 85 (see FIG. 1B).

Figure 2F:
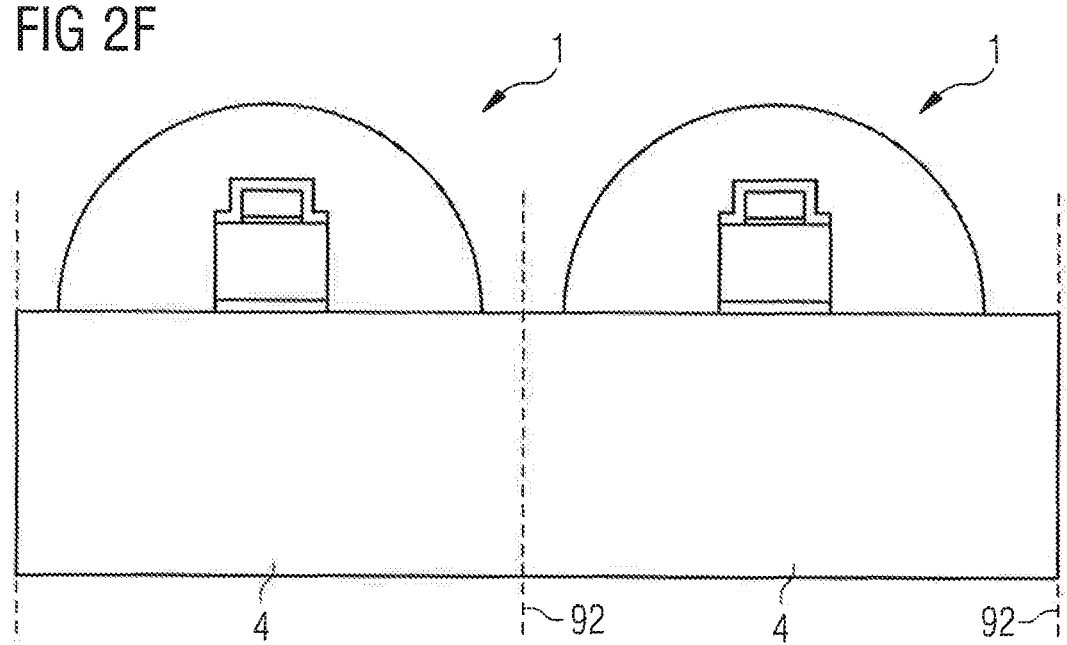

The secondary carrier composite 400 can subsequently be separated along further separation lines 92 as shown in FIG. 2F, so that single devices 1 are created.

Deviating from the exemplary embodiment described, the secondary carriers 4 may already be present in separated form in the process step shown in FIG. 2D, so that a final separation of the secondary carrier composite into secondary carriers 4, as shown in FIG. 2F, is not necessary.

With the methods described, the semiconductor chips 2 can be electrically contacted and provided with radiation conversion material while still being arranged in the composite, i.e., the primary carrier composite. The resulting "luminous stripes" can then be placed on a further carrier, i.e., the secondary carrier. The radiation conversion material 6 can be formed easily and inexpensively by a spraying process. In particular, a one-sided coating of the primary carrier 3 is sufficient. This leads to considerable material savings and associated cost reductions.

The invention is not limited by the description of the exemplary embodiments. Rather, the invention includes any new feature and any combination of features, which in particular includes any combination of features in the claims, even if that feature or combination itself is not explicitly mentioned in the claims or the exemplary embodiments.

What is claimed is:

1. A device comprising:
   a primary carrier;
   a plurality of semiconductor chips arranged on the primary carrier, the plurality of semiconductor chips configured to generate primary radiation;
   a radiation conversion material arranged at least in places on the semiconductor chips and the primary carrier, the radiation conversion material configured to at least partially convert the primary radiation into secondary radiation;
   a secondary carrier to which the primary carrier is attached; and
   a scattering body arranged on a front side of the secondary carrier facing the primary carrier, the scattering body covering the semiconductor chips,
   wherein the primary carrier is formed reflective to the primary radiation at least in a region of the semiconductor chips, and
   wherein, during operation of the device, at least the secondary radiation exits through a front side of the scattering body facing away from the secondary carrier and through a rear side of the secondary carrier facing away from the primary carrier.

2. The device according to claim 1, wherein a side surface of the primary carrier and the radiation conversion material terminate flush.

3. The device according to claim 2, wherein the side surface of the primary carrier and the radiation conversion material shows traces of a material removal.

4. The device according to claim 1, wherein at least 30% and at most 60% of a total radiated radiation exits the device through the secondary carrier.

5. The device according to claim 1, wherein the scattering body contains diffusers in a proportion of at least 5% by weight and at most 30% by weight.

6. The device according to claim 1, wherein the semiconductor chips are arranged next to one another along a main extension direction of the device.

7. The device according to claim 6, wherein a transverse extent of the scattering body along a direction perpendicular to the main extension direction and parallel to the front side of the secondary carrier is between and including twice as large and including ten times as large as a transverse extent of the primary carrier along this direction.

8. The device according to claim 1, further comprising an end contact at each opposite end along the main extension direction.

9. The device according to claim 8, wherein the primary carrier has a connecting surface at each opposite end along the main extension direction, which connecting surfaces are connected via a connecting line to the semiconductor chip closest to the respective connecting surface, and wherein the end contacts are arranged on the secondary carrier and each are electrically conductively connected to one of the connecting surfaces via a connector.

10. The device according to claim 1, wherein the device is an LED filament.

* * * * *